(12) United States Patent
Kieslich et al.

(10) Patent No.: US 6,638,814 B1
(45) Date of Patent: Oct. 28, 2003

(54) METHOD FOR PRODUCING AN INSULATION

(75) Inventors: Albrecht Kieslich, Radebeul (DE); Klaus Feldner, Dresden (DE); Herbert Benzinger, Munich (DE)

(73) Assignee: Infineon Technologies Aktiengesellschaft, Münich (DE)

( * ) Notice: Subject to any disclaimer, the term of this patent is extended or adjusted under 35 U.S.C. 154(b) by 0 days.

(21) Appl. No.: 10/031,743

(22) PCT Filed: Aug. 9, 2000

(86) PCT No.: PCT/EP00/07749

§ 371 (c)(1),
(2), (4) Date: Jan. 23, 2002

(87) PCT Pub. No.: WO01/11682

PCT Pub. Date: Feb. 15, 2001

(30) Foreign Application Priority Data

Aug. 9, 1999 (DE) .......................................... 199 37 504

(51) Int. Cl.[7] .......................................... H01L 21/8242
(52) U.S. Cl. ........................ 438/246; 438/248; 257/297; 257/301
(58) Field of Search ................................ 438/243, 246, 438/248, 249; 257/296, 297, 301

(56) References Cited

U.S. PATENT DOCUMENTS

| 4,658,283 A | 4/1987 | Koyama |
| 4,897,702 A | 1/1990 | Sunouchi |
| 5,021,852 A | 6/1991 | Sukegawa et al. |
| 5,559,350 A | 9/1996 | Ozaki et al. |

FOREIGN PATENT DOCUMENTS

| EP | 0 220 108 | 4/1987 |
| EP | 0 224 213 | 6/1987 |
| EP | 0 550 894 | 7/1993 |
| EP | 0 884 776 | 12/1998 |
| EP | 0 905 784 | 3/1999 |
| JP | 60-211969 | 10/1985 |
| JP | 61-156859 | 7/1986 |
| JP | 63-252467 | 10/1988 |
| JP | 05-251662 | 9/1993 |
| TW | 82102245 | 3/1993 |

OTHER PUBLICATIONS

Stanley Wolf Silicon Processing for the VSLI ERA vol2 Lattice Press 1990 p. 194.*

* cited by examiner

Primary Examiner—Carl Whitehead, Jr.
Assistant Examiner—David S Blum
(74) Attorney, Agent, or Firm—Schiff Hardin & Waite

(57) ABSTRACT

A method for producing a semiconductor device having a first region with storage capacitors and a second region with at least one well surrounded by an insulation. The method creates both the storage capacitors and the insulation by forming trenches in the first region and at least one trench in the second region, and the trenches have a depth of at least 2 μm. The trenches in the first region are treated to provide first and second electrodes separated by a dielectric to form the capacitors and each trench in the second region provides an insulation which surrounds any wells in the second region.

16 Claims, 9 Drawing Sheets

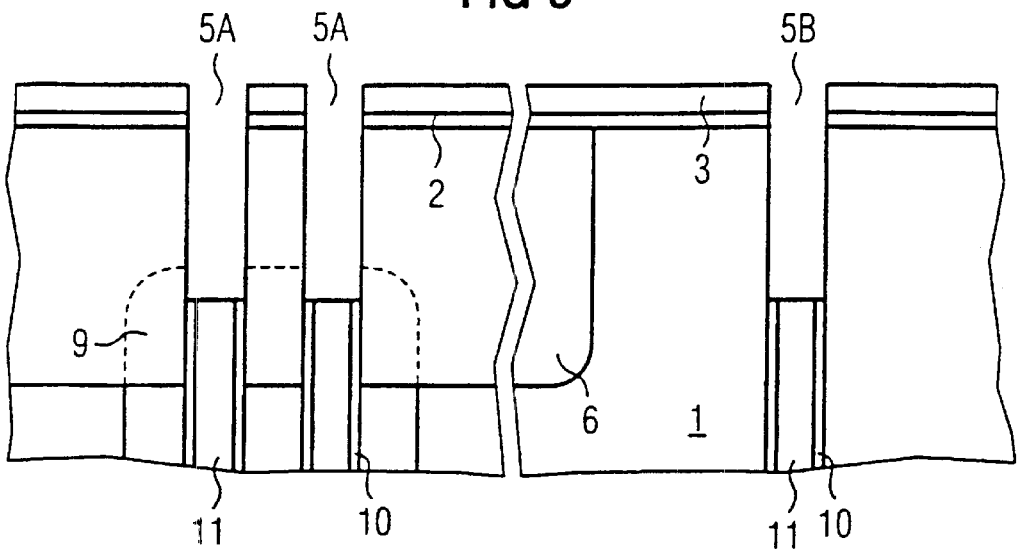
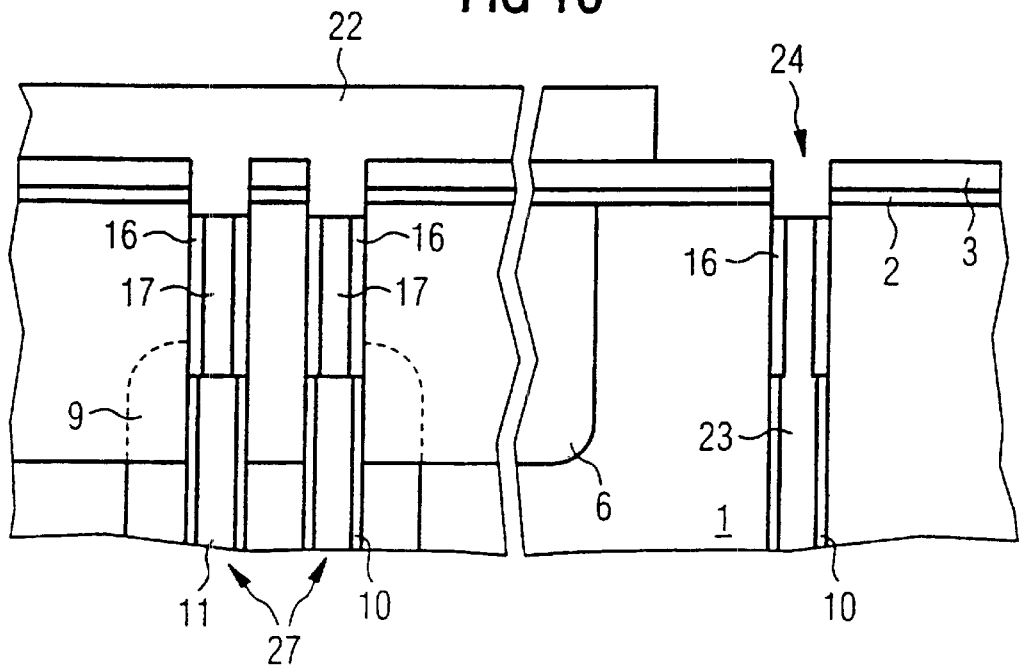

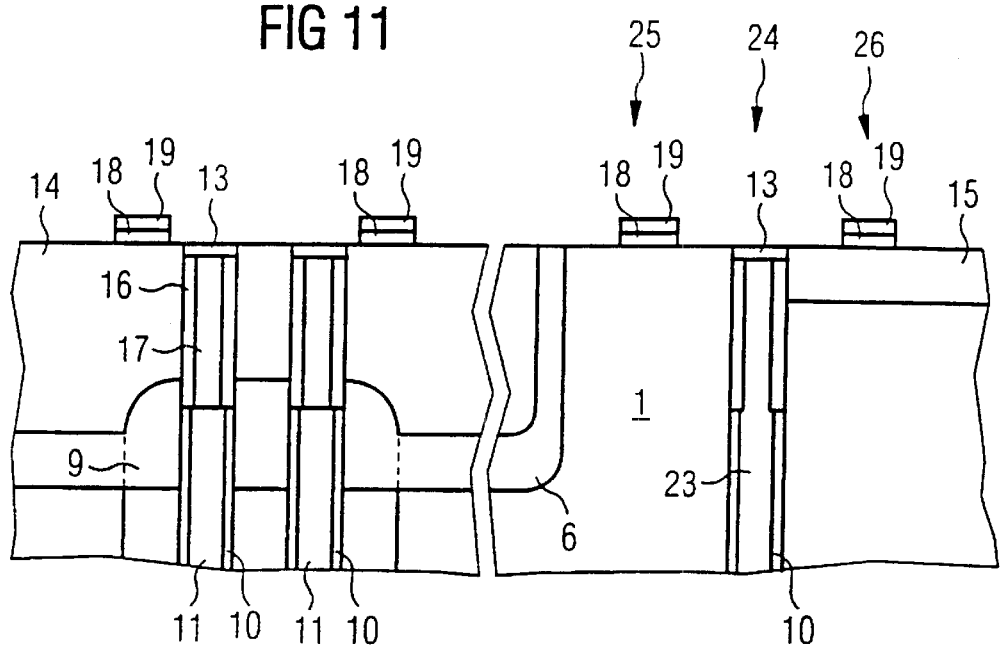
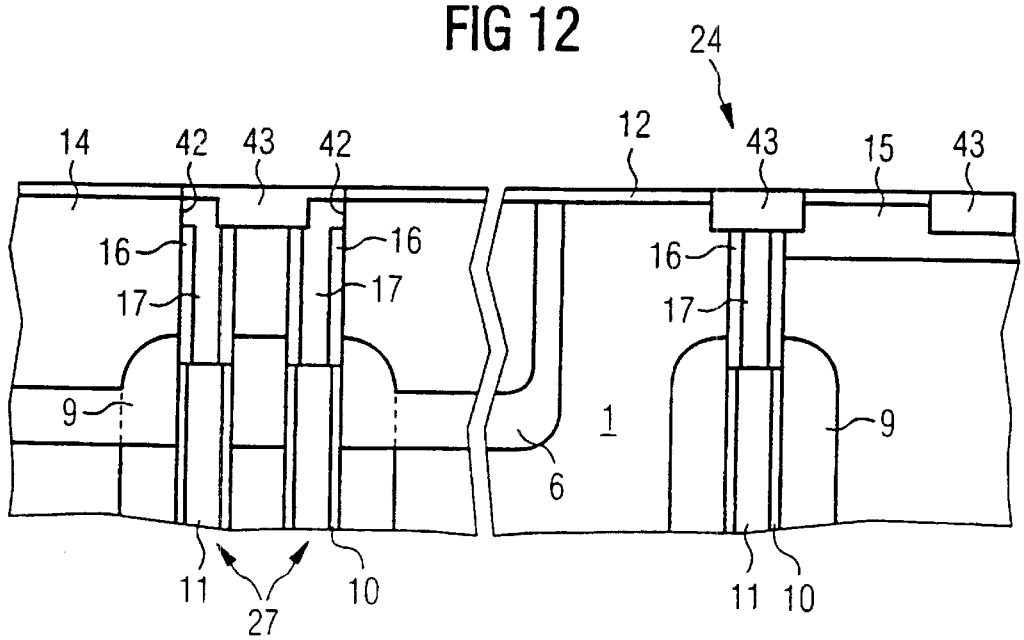

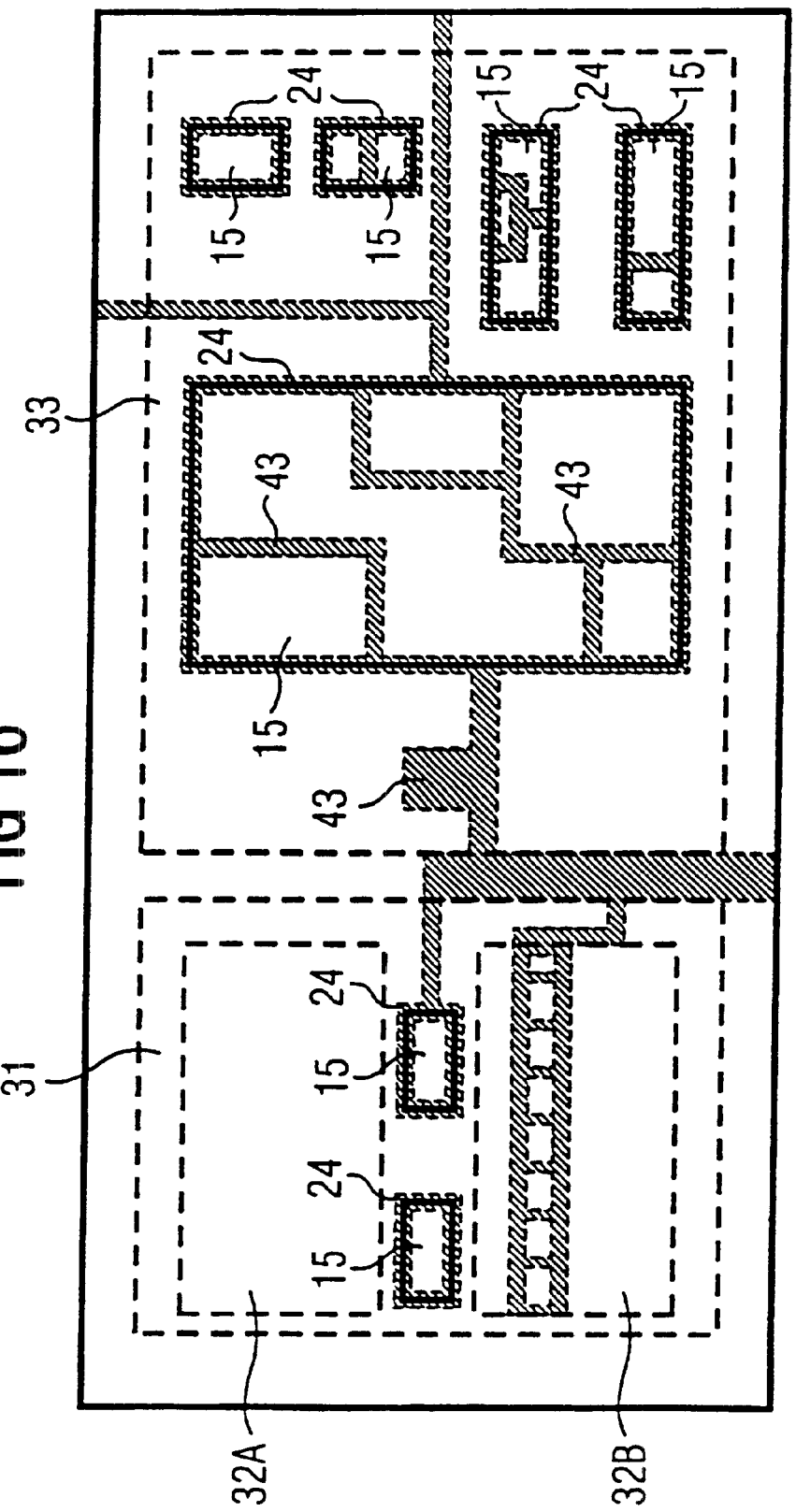

METHOD FOR PRODUCING AN INSULATION

BACKGROUND OF THE INVENTION

The invention is directed to a method for producing an insulation, particularly a well insulation, between two regions of different conductivity in a semiconductor component.

The goal of many developments in electronics is to continuously reduce the costs to be expended for the realization of a specific electronic function and, thus, to continuously increase the productivity. This enhancement of the productivity was and is particularly achieved by an increased integration of the electronic functions. The increase in the integration of the electronic functions is in turn mainly achieved by a progressive structural miniaturization of the individual components.

Logic circuits, which are usually manufactured with a CMOS process, are usually composed of n-channel or, respectively, p-channel MOS transistors. Thus, the corresponding substrate regions are formed by p-wells or, respectively, n-wells. The demand that the expanse of the circuits be reduced farther and farther is opposed, among other things, by the technology-dependent minimum distance between neighboring n-regions and p-regions. This minimum distance is one of the most important design rules for CMOS circuits. In particular, the minimum distance contributes to avoiding a latch-up effect that is produced by the formation of parasitic thyristor structures between neighboring n-channel and p-channel transistors.

A number of measures are known for further reducing the minimum distance between neighboring n-regions and p-regions without thereby simultaneously increasing the risk of the latch-up effect. In the case of an n-well, first, the p-substrate can be provided wiht a negative bias or, respectively, a p$^+$-substrate wiht a p-epitaxial layer can be employed. An additional measure is by employing optimally many well and substrate contacts and thereby keeping the potential in the well and in the substrate constant and, therefore, avoiding voltage drop-offs that can trigger a latch-up.

The aforementioned measures, however, respectively require additional process steps, as a result whereof the overall process becomes more involved and, thus, expensive. Moreover, the minimum distance between neighboring n-regions and p-regions can thereby be diminished to only an extremely limited extent.

Over and above this, an increasing need for application-specific integrated semiconductor products will arise in the future that, in addition to comprising the logic units that are required for the respective applied purpose, also comprise memory units with memory capacities that are individually matched to the respective requirements. "Embedded solutions" or "embedded DRAM-products" are mentioned in this context. It has been found that a clear increase in the system performance is achieved by the integration of RAM structures on the application-specific semiconductor product. Given such an arrangement, thus, memory accesses can often be implemented within one system clock.

An example is integrated semiconductor products for speech analysis and speech recognition and these products store the signals that represent the spoken language in an integrated memory for a certain time so that the logic units are in the position to analyze the signals. Additional examples are controller modules or DSP structures that comprise DRAM memory cells in order to carry out their function as efficiently as possible. Entire systems ("systems on silicon") that are integrated in a single module are then often formed in this way.

Whereas pure logic circuits are constructed essentially only of transistors, a DRAM memory cell comprises both a transistor as well as a capacitor that stores the charge needed for the presentation of the information. The capacitor of the memory cell has electrodes of doped silicon or, respectively, polysilicon and a dielectric layer of silicon dioxide and/or silicon nitride arranged between the electrodes.

In order to be able to reproducibly read out the charge stored in a capacitor, a capacitance of approximately 30 fF is required for the capacitor. The simultaneous demand to constantly diminish the lateral expanse of the capacitor in order to achieve an increase of the storage density led to the use of either trench capacitors, wherein the capacitor extends vertically into the substrate, or what are referred to as stack capacitors, wherein the capacitor is arranged above the transistor in the memory cell.

Of course, the technological outlay in the manufacture of the module also rises due to the integration of extensive logic circuits and memory cells in a single module. An additional compulsion to reduce the area occurs at the same time. Since a significant part of the area of a module must be employed for the insulation, there is great interest in an optimally space-saving insulation. Over and above this, however, the insulation should be manufacturable without great additional outlay in order to keep the costs of the overall process low.

SUMMARY OF THE INVENTION

The invention is therefore based on the object of disclosing a method for producing an insulation that satisfies said demands. Another object of the present invention is to make a corresponding semiconductor component available.

Inventively, a method for the simultaneous production of storage capacitors and at least one well insulation in a semiconductor substrate is offered. The inventive method comprises the steps:

a) providing a semiconductor substrate having at least one first region for the acceptance of the storage capacitors and at least one second region for the acceptance of the insulation;

b) using an etching technique to generate a plurality of trenches in the first region and at least one trench in the second region, whereby the trenches in the first region and the trench or, respectively, trenches in the second region have a depth of more than 2 $\mu$m;

c) using a doping technique to create or generate a respectively first electrode on the trench walls at least in the first region;

d) using a film technique to create a respective dielectric in the trenches at least in the first region;

e) using a film technique to form or generate a respectively second electrode in the trenches at least in the first region, so that storage capacitors are formed in the first region; and f) implementing at least one well implantation, so that at least one well region that is laterally limited by the trenches is generated in the second region.

The inventive method has the advantage that the process steps are applied both in the first as well as in the second region of the substrate, so that the structures in the different regions of the substrate that are achieved by the respectively same process steps serve different functions. A plurality of storage capacitors are generated in this way in the first region, and the essentially same structure is employed as a well insulation in the second region. Since storage capacitors need very deep trenches (>2 $\mu$m), a very good insulation can be produced in this way without additional process outlay. Accordingly, the distances between individual components or between wells having different conductivity types can be clearly reduced without increasing the risk of what is referred to as a "latch-up". Thus, for example, the minimum distance between an n-channel transistor and a p-channel transistor can be reduced by about 30%.

According to a preferred embodiment, the trench in the second region is formed as a closed curve. For example, an n-well can be insulated from a p-substrate in this way.

In step c), dopant diffusion from a doping layer is preferably employed as the doping technique. Particularly given deep trenches, a doping of the trench walls can be most easily implemented in this way. It is thereby preferred when arsenic glass, which can be deposited with an arsenic-TEOS method, is employed as the doping layer.

It is also preferred when an NO-layer or ONO-layer is employed as the dielectric and a polysilicon which is doped in situ is employed as an electrode.

According to another preferred embodiment, the first electrodes are formed only in the first region. By fashioning a first electrode in the second region, a leakage path can be formed along the trench surface, which path impedes good insulation. It is therefore advantageous when the first electrodes are formed only in the first region. In this way, the distances between individual components or between wells having different conductivity types can be further reduced.

When dopant diffusion from a doping layer is employed as the doping technique, then it is preferred that the doping layer in the second region is removed before the dopant diffusion from the trench. It is thereby preferred that the dopant layer is removed from the trench with an etching. The first region is preferably covered with a resist mask during this etching, so that the doping layer remains in the trenches in the first region. An additional mask that covers the memory cell field is required for this purpose during the execution of the process.

It is also preferred that the second electrodes are formed only in the first region. When polysilicon which is doped in situ is employed as the second electrode, then it is preferred that the polysilicon is in turn removed from the trench in the second region after the deposition. It is thereby preferred that the polysilicon is removed from the trench with an etching. The first region is preferably covered with a resist mask during this etching, so that the polysilicon remains in the trenches in the first region. An additional mask that covers the memory cell field is again required for this purpose during the process execution. The same mask used for the removal of the doping layer can be employed for the removal of the polysilicon.

It is also preferred that insulating material is deposited in the trench in the second region instead of the second electrode. Silicon oxide or undoped polysilicon can be advantageously employed for this purpose.

By combining these measures, a well insulation can be achieved wherein the spacing of the active components, for example transistors or diodes, across the well boundary is only limited by the process tolerances. Overall, the spacings of the active components across the well boundaries can be reduced by about 50% compared to a traditional insulation ("locos" or "shallow trench insulation"). The chip area that is saved is correspondingly large, and this can now be utilized for other jobs.

The invention is presented in greater detail below on the basis of Figures of the drawing.

BRIEF DESCRIPTION OF THE DRAWINGS

FIGS. 7 through 11 are cross-sectional views illustrating a sequence of steps of a second inventive method for simultaneous production of storage capacitors and at least one insulation;

FIGS. 12 and 13 are cross-sectional views illustrating a modification of some steps of an embodiment of the first inventive method for the simultaneous production of storage capacitors and at least one insulation;

FIG. 16 is a schematic plan view of a semiconductor component produced in this way.

DESCRIPTION OF THE PREFERRED EMBODIMENTS

Figure 1:
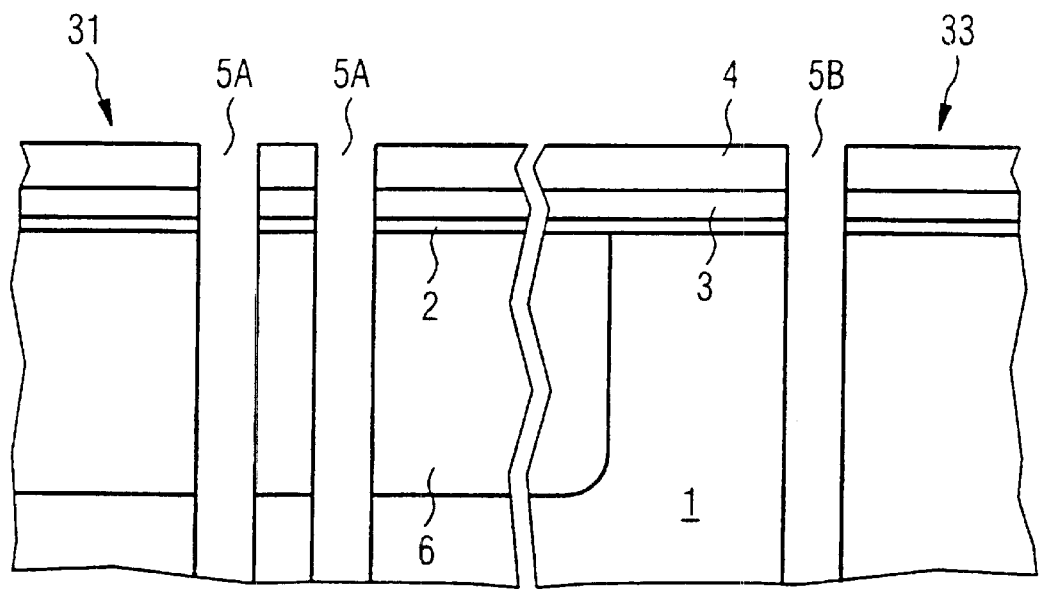
FIGS. 1 through 5 are cross-sectional views illustrating a sequence of steps of a first inventive method for simultaneous production of storage capacitors and at least one insulation.

FIGS. 1 through 5 show a first embodiment of the present invention. A silicon oxide layer 2, a silicon nitride layer 3 and a further or second silicon oxide layer 4 are arranged on a silicon substrate 1. The silicon oxide layers 2 and 4 as well as the silicon nitride layer 3 are structured with the assistance of a phototechnique, so that these layers can subsequently serve as a mask for the etching of the trenches. In the present example, the silicon substrate 1 is lightly p-doped. The n-conductive region 6 was also generated with an ion implantation in a first region 31 in which the storage capacitors are to be produced later.

An etching of the trenches 5A and 5B follows. The etching is thereby simultaneously implemented both in the first region 31 of the memory cells as well as in a second region 33 wherein the logic circuit is generated later. As a result of the etching, trenches 5A and 5B that are about 7 $\mu$m deep are produced and the structure which is formed is shown in FIG. 1.

Figure 2:
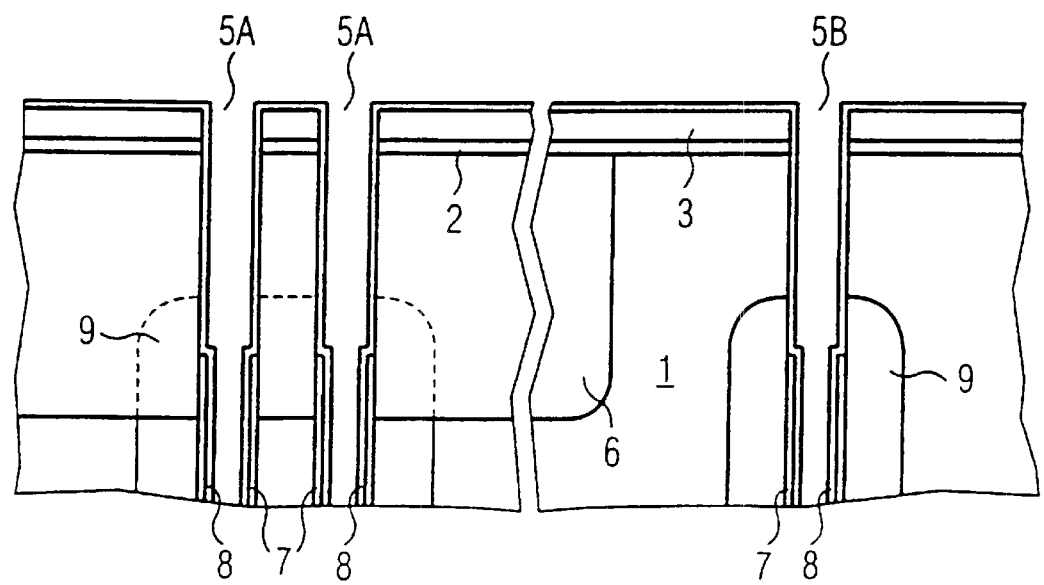

Subsequently, the silicon oxide layer 4 is removed (see FIG. 2). The deposition of a layer of arsenic glass 7 follows. The trenches 5A and 5B are filled with photoresist (not shown) up to a prescribed height by another phototechnique, and the arsenic glass layer 7 above the photoresist is in turn removed by an etching of the arsenic glass layer 7. The layer of arsenic glass 7 is covered with a further or another silicon oxide layer 8. This additional silicon oxide layer 8 prevents a contamination of the environment by the arsenic that is driven out.

After the removal of the remaining photoresist, a heat treatment is implemented in order to introduce the arsenic dopant from the arsenic glass layer 7 remaining in the trenches 5 into the substrate 1. A respective n-conductive diffusion region that respectively forms a first electrode 9 thereby arises at the sidewalls of the trenches 5A and 5B and the structure formed by these steps is shown in FIG. 2.

Figure 3:
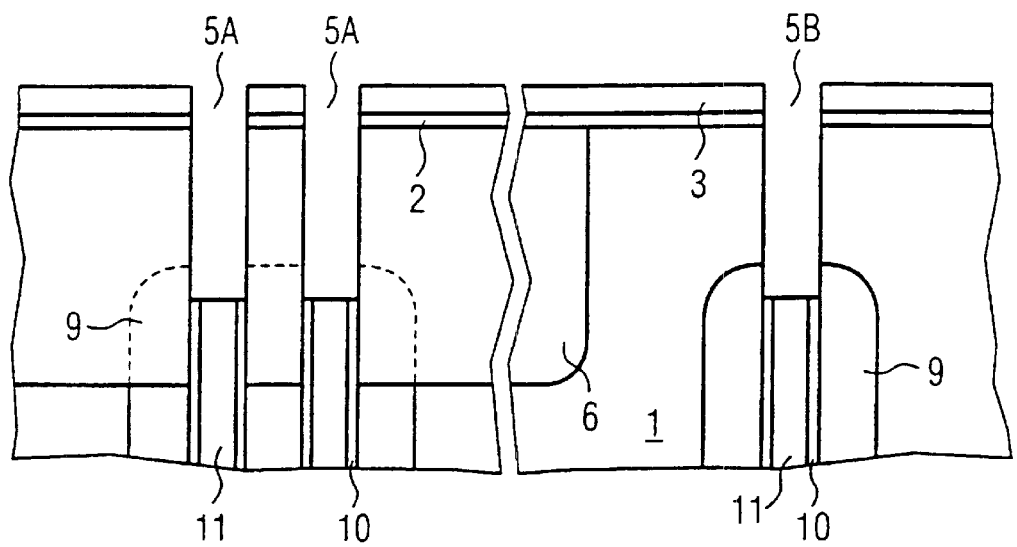

The silicon oxide layer 8 and the arsenic glass layer 7 that still remains are subsequently removed (see FIG. 3). This is followed by the deposition of what is referred to as an ONO-layer 10 that is composed of a silicon oxide layer, of a silicon nitride layer and of a silicon oxide layer. This layer sequence serves as dielectric for the storage capacitor. Subsequently, the trenches are filled up with polysilicon 11 which is doped in situ, i.e. the polysilicon is doped with a dopant during its deposition. Accordingly, the polysilicon forms the second electrode of the storage capacitors. Subsequently, the polysilicon 11 and the ONO-layer 10 are removed down to a prescribed depth in the trenches 5A and 5B with a number of etchings and the structure formed by these steps is shown in FIG. 3.

Figure 4:
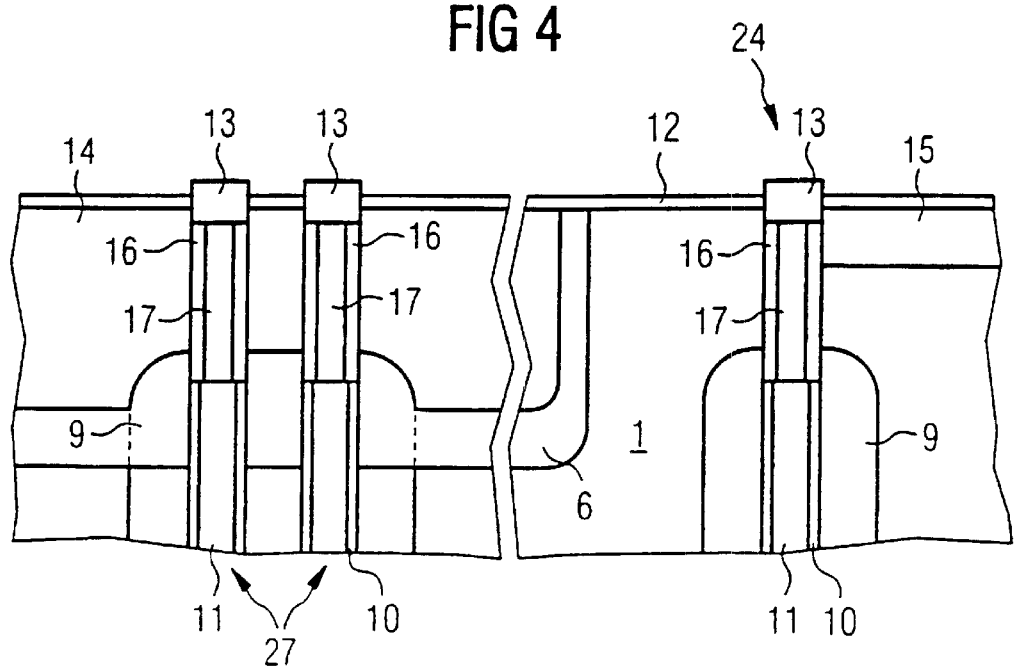

Subsequently, a still further silicon oxide layer 16 is conformally deposited and structured with an anisotropic etching so that the silicon oxide layer 16 only remains on the sidewalls of the trenches 5A and 5B above the ONO-layer 10 (see FIG. 4). This silicon oxide layer 16 forms what is referred to as a collar that is intended later to prevent a parasitic n-channel transistor along the sidewall of the trenches 5A and 5B in the memory cell field. Subsequently, the parts of the trenches 5A and 5B that are still free are filled with polysilicon 17 which is doped in situ, so that there is a conductive connection to the second electrode 11.

This is followed by the generation of what are referred to as buried contacts (not shown) for the connection of the second electrode 11 to the selection transistor that is still to be produced in every memory cell. The storage capacitors 27 have thus been finished. Subsequently, the upper sides of the trenches 5A and 5B are insulated from the substrate surface with yet another silicon oxide layer 13. In addition, the silicon nitride layer 3 and the silicon oxide layer 2 are removed, and a thin silicon oxide layer 12 is generated that is employed as a thin scattering oxide layer during the ion implantation that now follows. What is referred to as an n-well 15 is generated in the second region 33 of the substrate by an ion implantation. Later, the p-channel transistors are arranged in this n-well 15. The insulation 24 that is formed by the trench 5B thereby separates the n-well 15 from the surrounding p-conductive substrate 1. What is referred to as a p-well 14 is generated in the first region 31 of the substrate by an additional implantation. The structure formed by these steps is shown in FIG. 4.

Figure 5:
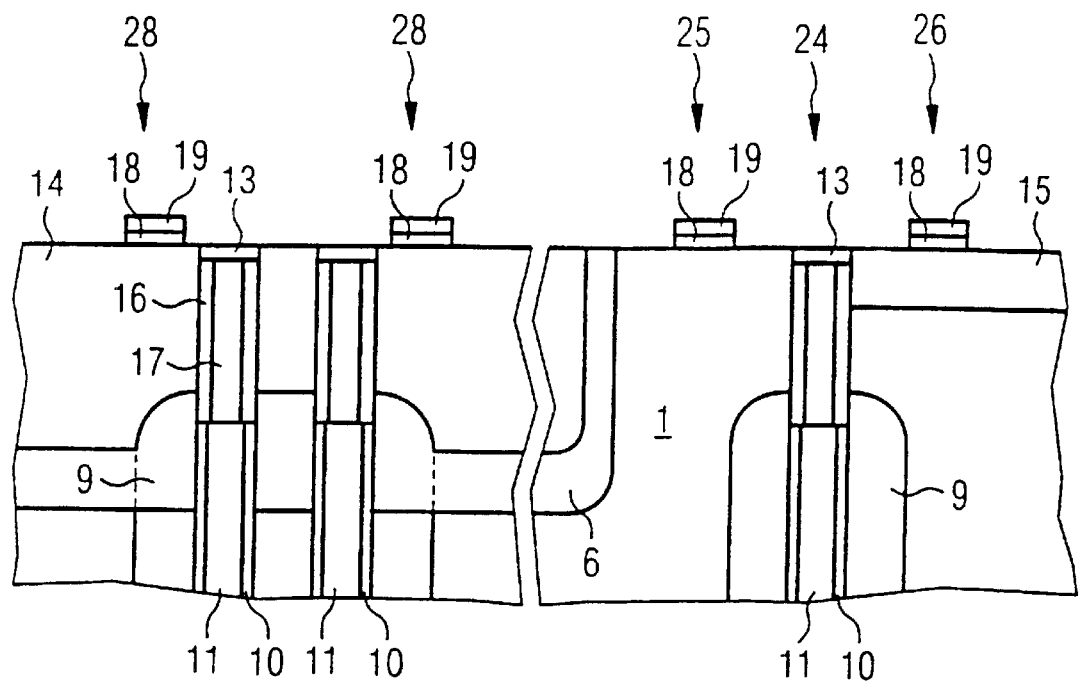

Subsequently, the thin silicon oxide layer 12 is removed, so that a further silicon oxide layer—what is referred to as the gate oxide (not shown)—can be generated on the surface of the substrate (see FIG. 5). A layer of polysilicon 18 is deposited onto the gate oxide, and a metal silicide layer 19 for reducing the resistance is in turn deposited on the layer of polysilicon 18. The metal silicide layer 19 and the silicon layer 18 are structured in order to generate what are referred to as the gate tracks. The transistors 25, 26 and 28 are finished by the subsequent ion implantation of arsenic or, respectively, boron. The transistors 28 thereby serve as selection transistors in the memory cells, whereas the transistors 25 and 26 are employed in the logic unit. The structure resulting from the steps is shown in FIG. 5.

For completing the semiconductor component, a metallization is subsequently generated that connects the transistors to one another according to the function to be realized and to the outside world. The steps needed for this purpose are known in and of themselves and are therefore not explained in greater detail.

Figure 6:
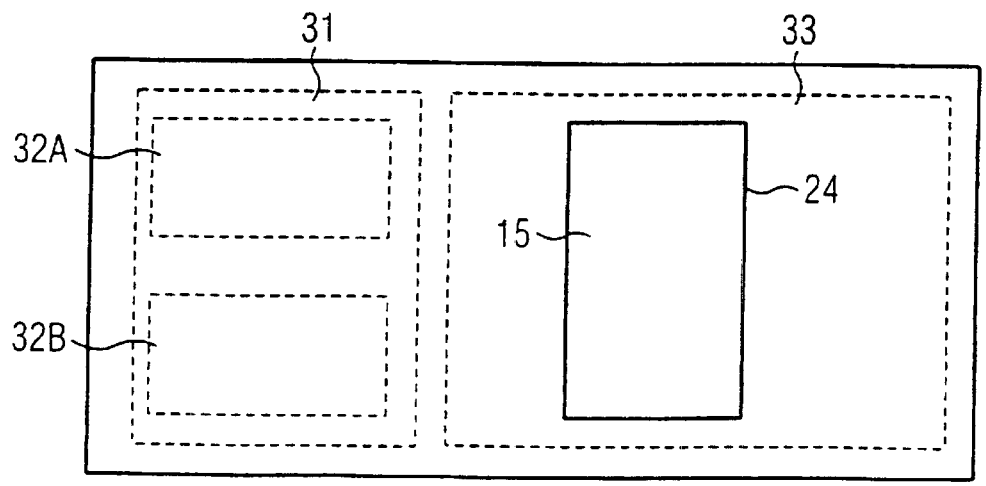
FIG. 6 is a schematic plan view of a semiconductor component produced in this way.

In a plan view, FIG. 6 schematically shows the structure of the semiconductor component manufactured in this way. The memory cell fields 32A and 32B are arranged in the first region 31 of the substrate at the left side of the drawing. The logic circuit is arranged in the second region of the substrate at the right side of the drawing. In order to insulate the n-well 15 from the rest of the logic circuit, the insulation 24 is fashioned as a closed curve or rectangular shape that completely surrounds the n-well 15. The insulating effect of the trench 5B is so good that the minimum distance between the n-channel transistor 25 and the p-channel transistor 26 can be clearly reduced without increasing the risk of the "latch-up" effect. The distance can be reduced by up to 30% compared to a traditional "locos" or "shallow trench" insulation.

FIGS. 7 through 11 show a second embodiment of the present invention.

A silicon oxide layer 2, a silicon nitride layer 3 and a further or second silicon oxide layer 4 are arranged on a silicon substrate 1. The silicon oxide layers 2 and 4 as well as the silicon nitride layer 3 are structured with the assistance of a phototechnique in order to subsequently serve as a mask for the etching of the trenches. In the present example, the silicon substrate 1 is lightly p-doped. The n-conductive region 6 was also generated with an ion implantation in the region 31 in which the storage capacitors are to be produced later.

The etching of the trenches 5A and 5B follows. The etching is thereby implemented both in the first region 31 of the memory cells as well as in the second region 33 where the logic circuit is later generated. As a result of the etching, trenches 5A and 5B that are about 7 μm deep are produced. Subsequently, the silicon oxide layer 4 is removed. The deposition of a layer of arsenic glass 7 follows. The trenches 5A and 5B are filled with photoresist 29 up to a prescribed height by another phototechnique, and the arsenic glass layer 7 above the photoresist is in turn removed by an etching of the arsenic glass layer 7. The layer of arsenic glass 7 is covered with a further or another silicon oxide layer 8. This additional silicon oxide layer 8 prevents a contamination of the environment by the arsenic that is driven out.

Figure 7:
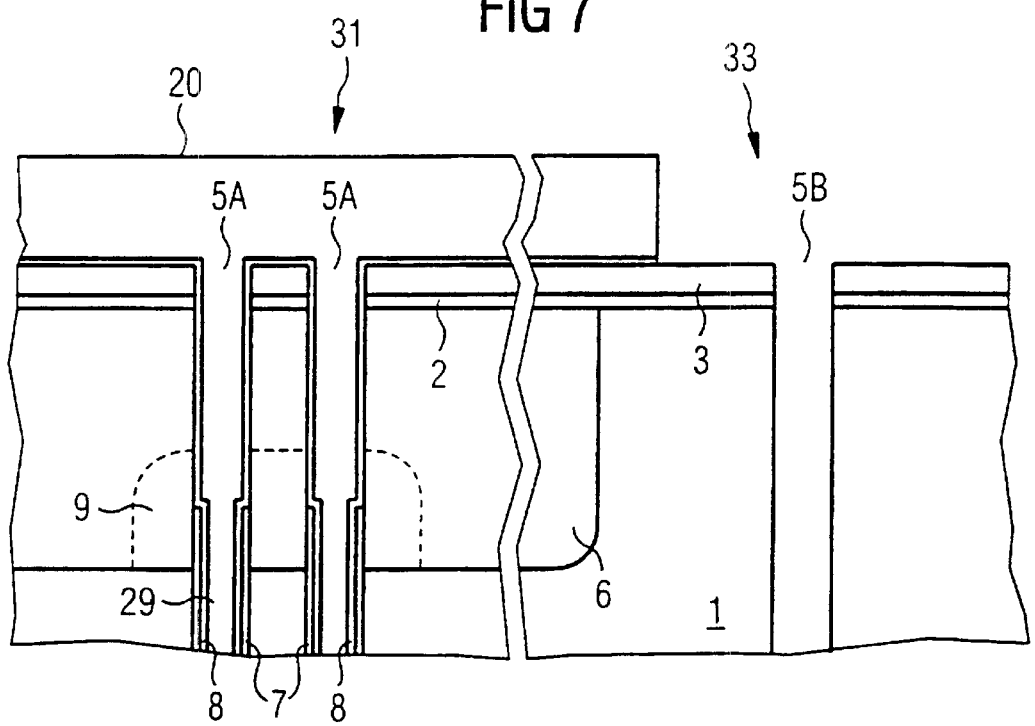

In order to prevent the arsenic dopant at the sidewall of the trench 5B from diffusing into the substrate 1, a resist mask 20 that covers the first region 31 of the substrate but leaves the second region 33 of the substrate free is generated by an additional phototechnique. Subsequently, the layers 7 and 8 still remaining in the trench 5B are removed from the trench 5B and the structure formed by these steps is shown in FIG. 7.

Figure 8:
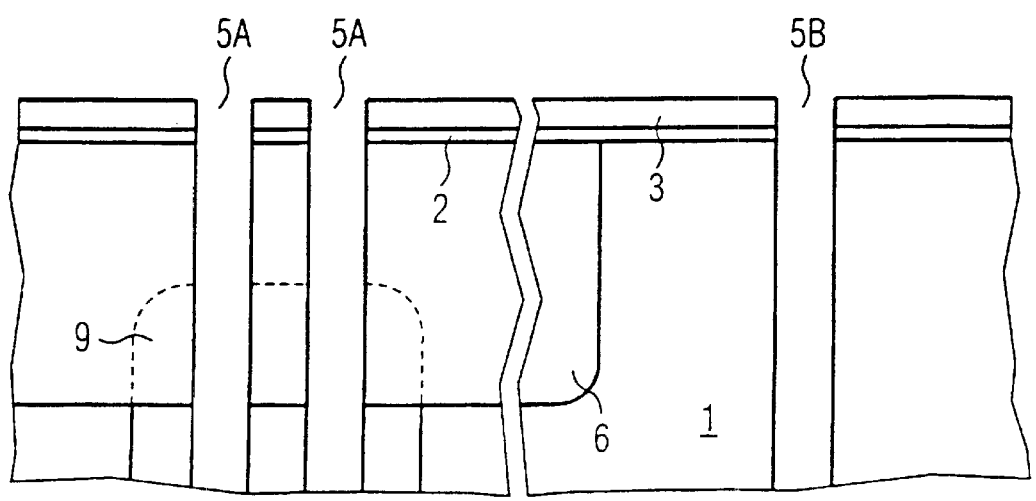

After the removal of the resist mask 20 and the remaining photoresist 29, a heat treatment is implemented in order to introduce the arsenic dopant from the arsenic glass layer 7 remaining in the trenches 5A into the substrate 1. A respective n-conductive diffusion region that respectively forms a first electrode 9 thereby arises on the sidewalls of the trenches SA. The sidewalls of the trench SB, in contrast, remain undoped. The silicon oxide layer 8 and the arsenic glass layer 7 that still remains are subsequently removed. The structure resulting from these steps is shown in FIG. 8.

This is followed by the deposition of what is referred to as the ONO-layer 10 (see FIG. 9). This layer sequence serves as dielectric for the storage capacitor. Subsequently, the trenches are filled up with polysilicon 11 which is doped in situ. Accordingly, the polysilicon 1 1 forms the second electrode of the storage capacitors. Subsequently, the polysilicon 11 and the ONO-layer 10 are removed down to a prescribed depth in the trenches 5A and 5B by a number of etchings. The structure formed by these steps is shown in FIG. 9.

Subsequently, a still further silicon oxide layer 16 is conformally deposited and structured with an anisotropic etching so that the silicon oxide layer 16 only remains on the sidewalls of the trenches 5A and 5B above the ONO-layer 10 (see FIG. 10). This silicon oxide layer 16 forms what is referred to as a collar that is intended later to prevent a parasitic n-channel transistor along the sidewall of the trenches 5A in the memory cell field. Subsequently, the parts of the trenches 5A and 5B that are still free are filled with polysilicon 17 which is doped in situ, so that there is a conductive connection to the second electrode 11. This is followed by the generation of what are referred to as buried contacts (not shown) for the connection of the second electrode 11 to the selection transistor that is still to be produced in every memory cell. The storage capacitors have thus been essentially finished.

In order to further enhance the insulating effect of the insulation 24, the first region 31 of the substrate is subsequently again covered with a resist mask 22. The doped polysilicon 11 and 17 is now removed from the trench 5B with an additional etching. Subsequently, the trench 5B is filled with silicon oxide 23. The structure resulting from these steps is shown in FIG. 10.

Subsequently, the resist mask 22 is in turn removed and the upper sides of the trenches 5 are insulated from the substrate surface with yet another silicon oxide layer 13 (see FIG. 11). In addition, the silicon nitride layer 3 and the silicon oxide layer 2 are removed, and a thin silicon oxide layer is generated that is employed as thin scattering oxide layer in the ion implantation that now follows. What is referred to as an n-well 15 is generated in the second region 33 of the substrate by an ion implantation. Later, the p-channel transistors are arranged in this n-well 15. The insulation 24 thereby separates the n-well 15 from the surrounding substrate 1. What is referred to as a p-well 14 is generated in the first region 31 of the substrate by an additional ion implantation.

Subsequently, the thin silicon oxide layer is removed, so that a further silicon oxide layer—what is referred to as the gate oxide (not shown)—can be generated on the surface of the substrate. A layer of polysilicon 18 is deposited onto the gate oxide, a metal silicide layer 19 for reducing the resistance is in turn deposited on the layer of polysilicon 18. The metal silicide layer 19 and the silicon layer 18 are structured in order to generate what are referred to as the gate tracks. The transistors 25, 26 and 28 are finished by the subsequent ion implantation of arsenic or, respectively, boron. The structure resulting from these steps is shown in FIG. 11.

For completing the semiconductor component, a metallization is subsequently generated that connects the transistors to one another according to the function to be realized and to the outside world. The steps needed for this purpose are known in and of themselves and are therefore not explained in greater detail.

Since a doping of the sidewall of the trench 5B is prevented and since the trench 5B is filled with an electrically insulating material, a well insulation can be achieved with which the spacing of the transistors 25 and 26 across the well boundary is only limited by the process tolerances. Overall, the spacings of the active components across well boundaries can be reduced by about 50% compared to a traditional insulation ("locos" or "shallow trench insulation"). The chip area that is saved is correspondingly large, and this can now be utilized for other jobs.

Figure 13:
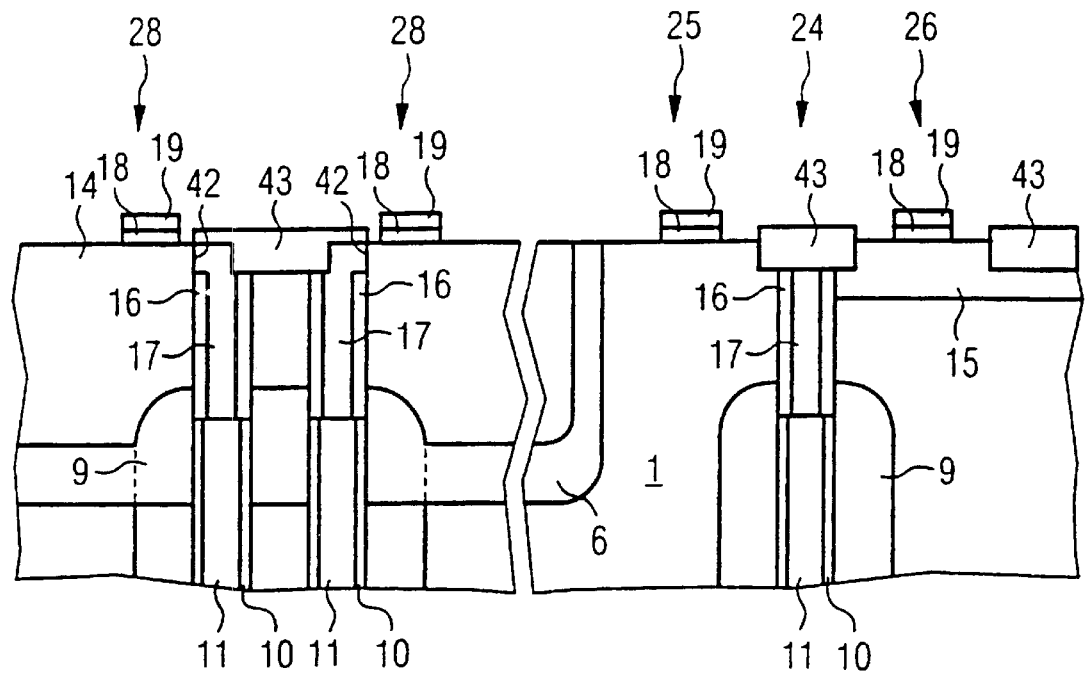

FIGS. 12 and 13 show a modification of the first embodiment of the present invention. The first steps of this method correspond to the steps that were explained in conjunction with FIGS. 1 through 3, so that a repetition of the description of these steps can be omitted.

Proceeding from FIG. 3, a still further silicon oxide layer 16 is conformally deposited and structured with an anisotropic etching so that the silicon oxide layer 16 only remains on the sidewalls of the trenches 5A and 5B above the ONO-layer 10 (see FIG. 12). This silicon oxide layer 16 forms what is referred to as a collar that is intended later to prevent a parasitic n-channel transistor along the sidewall of the trenches 5A and 5B in the memory cell field. Subsequently, the parts of the trenches 5A and 5B that are still free are filled with polysilicon 17, which is doped in situ, so that there is a conductive connection to the second electrode 11.

This is followed by the generation of what are referred to as buried contacts (not shown) for the connection of the second electrode 11 to the selection transistor that is still to be produced in every memory cell. To that end, the polysilicon layer 17 and the silicon oxide layer 16 are removed down to a prescribed depth, so that the contact surfaces to the sidewalls of the trenches are uncovered. Advantageously, doped polysilicon is deposited and structured in order to complete the buried contact 42.

After generating the buried contacts, what is referred to as a "shallow trench isolation" (STI) 43 is produced. To this end, relatively shallow trenches that are filled with silicon oxide are generated at the substrate surface. The "shallow trench isolation" serves the purpose of insulating the individual components. This insulation is therefore to be encountered everywhere on the chip surface. In FIG. 12, for example, the two neighboring capacitors 27 are electrically insulated from one another by the shallow trench isolation. In addition, a shallow trench isolation 43 is present on the insulation 24.

The storage capacitors 27 have thus been completed. Subsequently, the silicon nitride layer 3 and the silicon oxide layer 2 are removed, and a thin silicon oxide layer 12 is generated that is employed as a thin scattering oxide layer during the ion implantation that now follows.

What is referred to as an n-well 15 is generated in the second region 33 of the substrate with an ion implantation. Later, the p-channel transistors are arranged in this n-well 15. The insulation 24 thereby separates the n-well 15 from the surrounding substrate 1. What is referred to as a p-well 14 is generated in the first region 31 of the substrate by an additional ion implantation. The structure formed by these steps is shown in FIG. 12.

Subsequently, the thin silicon oxide layer 12 is removed, so that a further silicon oxide layer—what is referred to as the gate oxide (not shown)—can be generated on the surface of the substrate (see FIG. 13). A layer of polysilicon 18 is deposited onto the gate oxide, and a metal silicide layer 19 for reducing the resistance is in turn deposited on the layer of polysilicon 18. The metal silicide layer 19 and the silicon layer 18 are structured in order to generate what are referred to as the gate tracks. The transistors 25, 26 and 28 are finished by the subsequent ion implantation of arsenic or, respectively, boron. The transistors 28 thereby serve as selection transistors in the memory cells, whereas the transistors 25 and 26 are employed in the logic unit. The structure resulting from these steps is shown in FIG. 13.

Figure 14:
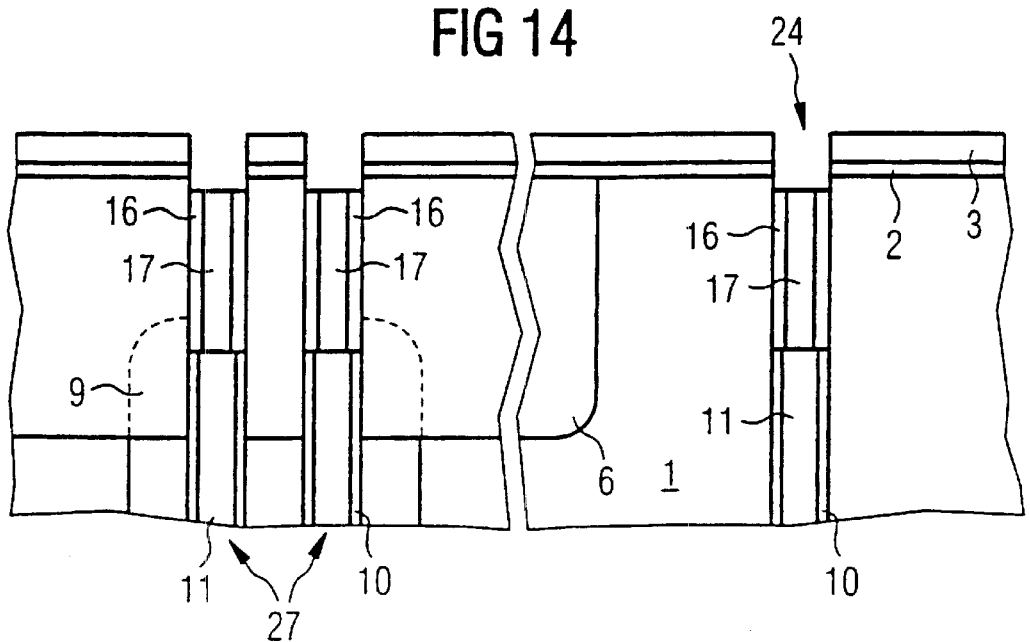
FIGS. 14 and 15 are cross-sectional views illustrating a modification of some steps of an embodiment of the second inventive method for the simultaneous production of storage capacitors and at least one insulation.
Figure 15:
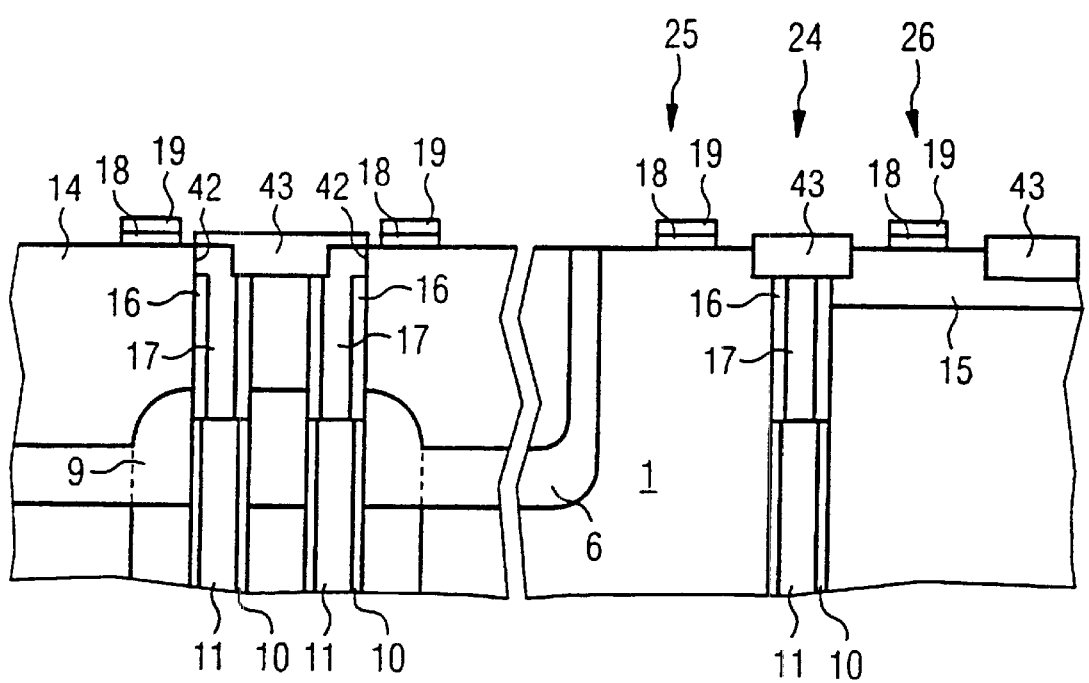

FIGS. 14 and 15 show an embodiment of the present invention of FIGS. 7–11. The first steps of this method correspond to the steps that were explained in conjunction with FIGS. 7 through 9, so that a repetition of the description of these steps can be omitted.

Subsequently, a still further silicon oxide layer 16 is conformally deposited and structured with an anisotropic etching so that the silicon oxide layer 16 only remains on the sidewalls of the trenches 5A and 5B above the ONO-layer 10 (see FIG. 14). This silicon oxide layer 16 forms what is referred to as a collar that is intended later to prevent a parasitic n-channel transistor along the sidewall of the trenches 5A in the memory cell field. Subsequently, the parts of the trenches 5A and 5B that are still free are filled with polysilicon 17 which is doped in situ, so that there is a conductive connection to the second electrode 11. For preparing the buried contacts, the polysilicon layer 17 and the silicon oxide layer 16 are subsequently removed down to a prescribed depth, so that the contact surfaces to the sidewalls of the trenches are uncovered. The structure resulting from these steps is shown in FIG. 14.

Subsequently, doped polysilicon is deposited and structured in order to complete the buried contact 42 (see FIG. 15). After generating the buried contacts, what is referred to as a "shallow trench isolation" (STI) 43 is produced. To this end, relatively shallow trenches that are filled with silicon oxide are generated at the substrate surface. The "shallow trench isolation" serves the purpose of insulating the individual components. This insulation is therefore to be encountered everywhere on the chip surface (see FIG. 16). In FIG. 15, for example, the two neighboring capacitors 27 are electrically insulated from one another by the shallow trench isolation. Further, a shallow trench isolation 43 is present on the insulation 24.

Subsequently, the silicon nitride layer 3 and the silicon oxide layer 2 are removed, and a thin silicon oxide layer is generated that is employed as thin scattering oxide layer during the ion implantation that now follows. What is referred to as an n-well 15 is generated in the second region 33 of the substrate by the ion implantation. Later, the p-channel transistors are arranged in this n-well 15. The insulation 24 thereby separates the n-well 15 from the surrounding substrate 1. What is referred to as a p-well 14 is generated in the first region 31 of the substrate by a further ion implantation.

Subsequently, the thin silicon oxide layer is removed, so that a further silicon oxide layer—what is referred to as the gate oxide (not shown)—can be generated on the surface of the substrate. A layer of polysilicon 18 is deposited onto the gate oxide, and a metal silicide layer 19 for reducing the resistance is in turn deposited on said layer of polysilicon 18. The metal silicide layer 19 and the silicon layer 18 are structured in order to generate what are referred to as the gate tracks. The transistors 25, 26 and 28 are finished by the subsequent ion implantation of arsenic or, respectively, boron. The structure resulting from these steps is shown in FIG. 15.

In a plan view, FIG. 16 schematically shows the structure of the semiconductor component manufactured in this way. The memory cell fields 32A and 32B are thereby arranged in the first region 31 of the substrate at the left side of the drawing. The logic circuit is arranged in the second region 33 of the substrate at the right side of the drawing.

In this embodiment, both the memory region 31 as well as logic region contain a plurality of n-wells 15 that are respectively limited by insulations 24. In order to insulate the n-wells 15 from the environment, each insulation 24 is fashioned as a closed curve that completely surround the n-wells 15. The insulating effect of the trench 5B is thereby so good that the minimum distance between the n-channel transistors and the corresponding p-channel transistors can be clearly reduced without increasing the risk of the "latch-up" effect. The distance can be reduced by up to 30% compared to a traditional "locos" or "shallow trench" insulation.

In addition to the insulation 24, FIG. 16 only schematically shows portions of the shallow trench isolation 43. The individual components are isolated from one another by the shallow trench isolation. Accordingly, the shallow trench isolation is to be encountered everywhere on the chip.

We claim:

1. A method for the simultaneous production of storage capacitors and at least one well insulation in a semiconductor substrate, said method comprising the steps of providing a semiconductor substrate having at least one first region for the acceptance of storage capacitors and at least one second region for the acceptance of insulation; etching to simultaneously form a plurality of trenches in the first region and at least one trench in the second region, each trench in the first and second regions having a depth of more than 2 $\mu$m; creating a first electrode on walls of the trenches in at least the first region utilizing a doping technique; forming a dielectric in the trenches at least in the first region using a film technique; creating a second electrode in the trenches at least in the first region using a film technique, so that storage capacitors are formed in the first region; and creating at least one well region in the second region utilizing a well implantation, said well region being laterally limited by the at least one trench of the second region.

2. A method according to claim 1, wherein each of the well regions in the second region is surrounded by the at least one trench forming a closed figure.

3. A method according to claim 1, wherein the step of creating a first electrode utilizing a doping technique includes depositing a doping layer on the walls of the trench and then causing a doping diffusion from the doping layer.

4. A method according to claim 3, wherein the step of depositing a doping layer deposits an arsenic glass utilizing an arsenic-TEOS method.

5. A method according to claim 1, wherein the step of forming a dielectric in the trenches provides at least a silicon nitride layer and a silicon oxide layer, said layers being arranged in a sequence selected from NO and ONO.

6. A method according to claim 1, wherein the step of forming the second electrode in the trenches of the first region provides a polysilicon which is doped in situ.

7. A method according to claim 1, which includes forming CMOS logic structures in the second region.

8. A method according to claim 1, wherein the step of forming the second electrodes forms second electrodes only in the first region.

9. A method according to claim 1, wherein the step of forming the second electrodes forms second electrodes only in the first region.

10. A method according to claim 9, wherein the step of forming the second electrodes includes depositing a polysilicon which is doped in situ in the trenches and subsequently removing the polysilicon from each trench in the second region.

11. A method according to claim 10, wherein the step of removing the polysilicon from each trench of the second region includes covering the first region with a resist mask and then etching the polysilicon from each trench in the second region.

12. A method according to claim 7, which includes depositing an insulating material in each trench of the second region after forming the second electrodes in the trenches of the first region.

13. A method according to claim 12, wherein the step of depositing an insulating material deposits a material selected from a group consisting of silicon oxide and undoped polysilicon.

14. A method for the simultaneous production of storage capacitors and at least one well insulation in a semiconductor substrate, said method comprising the steps of providing a semiconductor substrate having at least one first region for the acceptance of storage capacitors and at least one second region for the acceptance insulation; etching a plurality of trenches in the first region and at least one trench in the second region, each trench in the first and second regions having a depth of more than 2 $\mu$m; creating a first electrode on walls of the trenches in only the first region utilizing a doping technique including providing a doping layer on the walls of the trench, removing the doping layer from each trench in the second region and then diffusing the doping material into the wall of the trench; forming a dielectric in the trenches at least in the first region using a film technique; creating a second electrode in the trenches at least in the first region using a film technique, so that storage capacitors are formed in the first region; and creating at least one well region in the second region utilizing a well implantation.

15. A method according to claim 14, which includes, subsequent to depositing a doping layer on the walls of the trench, providing a resist mask to cover the trenches of the first region and then removing the doping layer from the walls of the second region by etching.

16. A semiconductor component having a semiconductor substrate having a first region for the acceptance of storage capacitors and a second region for the acceptance of insulation, a plurality of trenches in the first region and at least one trench in the second region, each of the trenches having a depth greater than 2 $\mu$m; a storage capacitor in each trench of the first region, each capacitor being formed by first electrodes being present on walls of each trench in the first region and a second electrode in each trench in the first region being separated from the first electrodes by dielectric films, at least one well implantation being present in the second region, said well implantation being surrounded by the at least one trench in the second region to isolate the well implantation from any transistors in the first region.

\* \* \* \* \*